United States Patent
Nampoothiri et al.

(10) Patent No.: US 10,489,300 B1
(45) Date of Patent: Nov. 26, 2019

(54) INCREASING CACHING EFFICIENCY USING CACHE DATA PATTERNS

(71) Applicant: QUALCOMM Incorporated, San Diego, CA (US)

(72) Inventors: Sankaran Nampoothiri, Bangalore (IN); Subodh Singh, Bangalore (IN); ShankarGanesh Kandasamy, Bangalore (IN); Avinash Philip, Bangalore (IN)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/055,844

(22) Filed: Aug. 6, 2018

(51) Int. Cl.
| | | |
|---|---|---|
| *G06F 12/08* | (2016.01) | |
| *G06F 12/0871* | (2016.01) | |
| *G06K 9/62* | (2006.01) | |
| *G06F 11/10* | (2006.01) | |
| *G06F 12/0868* | (2016.01) | |
| *G06F 12/0862* | (2016.01) | |
| *G06F 12/0846* | (2016.01) | |
| *G06F 12/0817* | (2016.01) | |

(52) U.S. Cl.
CPC ...... *G06F 12/0871* (2013.01); *G06F 11/1064* (2013.01); *G06F 12/0862* (2013.01); *G06F 12/0868* (2013.01); *G06K 9/6201* (2013.01); *G06F 12/082* (2013.01); *G06F 12/0846* (2013.01)

(58) Field of Classification Search
CPC ............. G06F 12/082; G06F 12/0822; G06F 12/0846; G06F 12/0853; G06F 12/0862
USPC ........................................................ 711/118
See application file for complete search history.

(56) References Cited

U.S. PATENT DOCUMENTS

| | | | |
|---|---|---|---|
| 2003/0221072 A1* | 11/2003 | Azevedo ............ | G06F 12/0862 711/154 |
| 2012/0137075 A1* | 5/2012 | Vorbach ................ | G06F 9/526 711/122 |
| 2017/0315810 A1* | 11/2017 | Eickemeyer ........ | G06F 9/30058 |
| 2018/0052785 A1* | 2/2018 | Suh ..................... | G06F 13/1673 |

* cited by examiner

*Primary Examiner* — Than Nguyen
(74) *Attorney, Agent, or Firm* — Patterson & Sheridan, L.L.P.

(57) ABSTRACT

Certain aspects of the present disclosure provide techniques for increasing processor caching efficiency by cache data pattern optimization. One embodiment includes a method for managing data in a cache, including: receiving data to be cached at the cache; determining that the data to be cached matches a predefined data pattern; and updating a tag RAM associated with the cache with a pattern tag comprising tag bits and pattern bits, wherein the pattern bits match the predefined data pattern.

20 Claims, 7 Drawing Sheets

INCREASING CACHING EFFICIENCY USING CACHE DATA PATTERNS

INTRODUCTION

Aspects of the present disclosure relate to increasing caching efficiency using cache data patterns.

A cache is a memory that may be coupled to a processor, such as central processing unit (CPU), graphics processing unit (GPU), or other processing units, to reduce the average cost (e.g., time or energy) to access data from a memory, such as a main system memory. Generally caches are smaller and faster memories located closer to a processor core, which store copies of data from frequently used main memory locations.

Caches are a critical resource for processing systems, which have a significant impact on overall system performance. However, because of chip space, power, and cost constraints, caches are often limited in size, especially relative to the main memory. For example, a cache may normally be measured in kilobytes (KB) or megabytes (MB) whereas main system memories are often an order of magnitude larger, measuring in gigabytes (GB) or even terabytes (TB). The relatively small size of caches relative to the amount of main memory available in systems and used by modern applications means that caches are often too small to store copies of all the relevant data from frequently used main memory locations. Because modern processing architecture normally involves checking the cache first, there is a performance hit when a processing system must first determine that the needed data is not stored in the cache (i.e., a cache miss) and then make a call to the main memory to gather the needed data.

Because it may be impractical to simply increase the cache size to resolve the challenges of a small cache relative to the size of main memories and the amount of data being used by a processing system at any given time, there is a need for methods of using the existing cache in a more effective and efficient manner.

BRIEF SUMMARY

Certain embodiments provide a method for managing data in a cache, including: receiving data to be cached at the cache; determining that the data to be cached matches a predefined data pattern; and updating a tag RAM associated with the cache with a pattern tag comprising tag bits and pattern bits, wherein the pattern bits match the predefined data pattern.

Further embodiments provide a method for managing data in a cache, including: receiving data to be cached at the cache; determining that a first portion of the data to be cached matches a predefined data pattern, wherein the predefined data pattern comprises a number of bits corresponding to less than a full cache line of a data RAM associated with the cache; updating a tag RAM associated with the cache with a granule pattern tag comprising granule tag bits, pattern bits, and granule index bits, wherein the pattern bits match the predefined data pattern; and updating a data RAM associated with the cache with a second portion of the data to be cached that does not match the predefined pattern, wherein the granule index bits refer to a location in the data RAM where the second portion of the data to be cached is written.

The following description and the related drawings set forth in detail certain illustrative features of one or more embodiments.

BRIEF DESCRIPTION OF THE DRAWINGS

The appended figures depict certain aspects of the one or more embodiments and are therefore not to be considered limiting of the scope of this disclosure.

To facilitate understanding, identical reference numerals have been used, where possible, to designate identical elements that are common to the drawings. It is contemplated that elements and features of one embodiment may be beneficially incorporated in other embodiments without further recitation.

DETAILED DESCRIPTION

Aspects of the present disclosure provide apparatuses, methods, processing systems, and computer readable mediums for increasing processor caching efficiency by cache data pattern optimization.

When a processor needs to read or write a location in a memory, such as a main system memory, it first checks for a corresponding entry in a cache, which is normally local to the processor. The cache checks for the contents of the requested memory location in any cache lines that might contain that address. Generally "cache lines" or "cache blocks" are of a fixed size.

When a cache line is copied from a memory into the cache, a cache entry is created. The cache entry will include the copied data as well as the requested memory location, which is often referred to as a "tag." If the processor finds that the memory location is in the cache, a cache hit has occurred. However, if the processor does not find the memory location in the cache, a cache miss has occurred. In the case of a cache hit, the processor immediately reads or writes the data in the cache line. For a cache miss, the cache allocates a new entry and copies data from main memory and thereafter the request is fulfilled from the contents of the cache.

Tag random access memory (RAM) is a specialized bank of static RAM used to hold memory addresses (e.g., referring to locations in a system's main memory). Tag RAM is used in processing systems (such as by a CPU, GPU, etc.) to keep track of which memory addresses are stored in a cache. The values stored in the tag RAM determine whether a cache lookup results in a hit or a miss. The actual data is stored in a different part of the cache, frequently referred to as a cache data store or data RAM. The size of the cache data store may influence how much data the cache can hold at any one time.

Embodiments described herein detect patterns in cache data and reference those patterns in special tag RAM entries called pattern tags. In some cases the pattern tags refer to an entire cache line write and in other cases the pattern tags refer to partial cache line writes. Utilizing pattern tag RAM significantly increases the efficiency of the cache because the pattern need not be written to the data RAM in the cache; rather, the pattern is encoded into the tag RAM entry itself. In this way, smaller caches are able to perform like larger caches—especially where data to be cached includes detectable patterns.

Example Direct-Mapped Cache Implementation

Figure 1A:
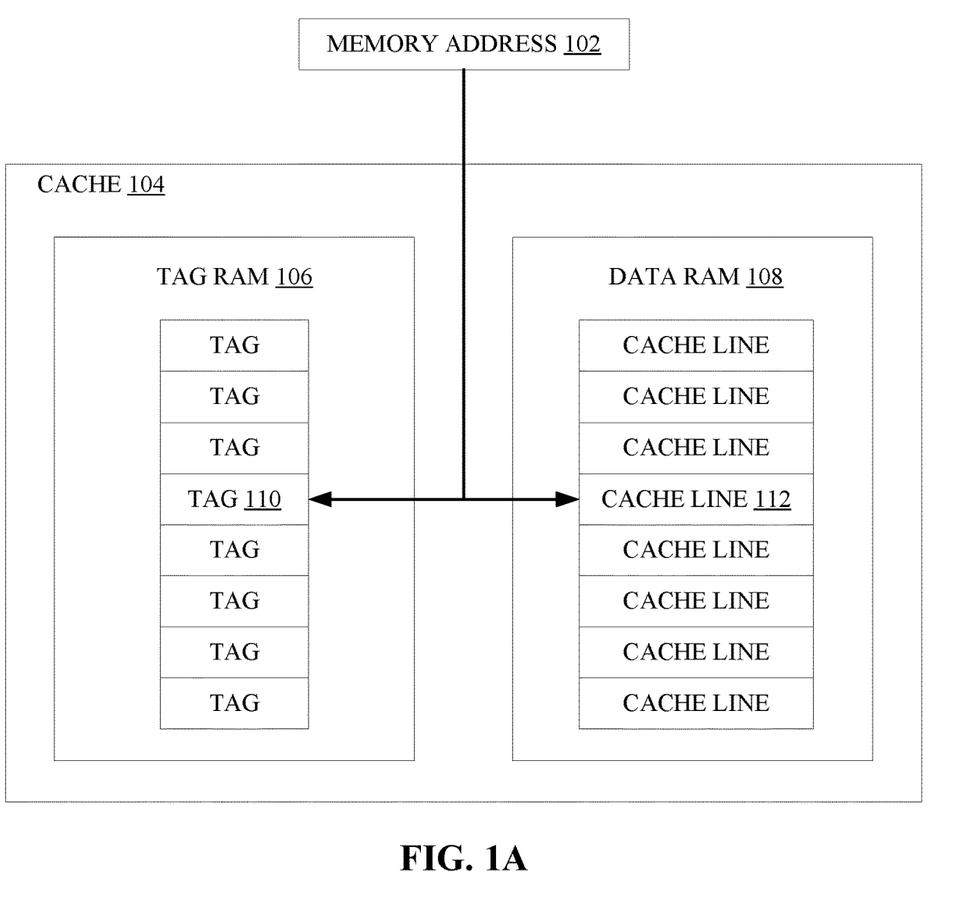
FIG. 1A depicts an example of a direct-mapped cache.

FIG. 1A depicts an example of a conventional direct-mapped cache 104. When a processor wants to read from or write to a memory address, such as memory address 102, it may first check a cache, such as cache 104. In particular, memory address 102 may comprise tag bits bits, index or set bits, and offset bits. Together these bits may be used to determine whether a memory address is cached, via a tag (e.g., 110), and if so, where the data resides in the data RAM 108. For example, if the address bits match an entry in a particular tag line (e.g., 110) of tag RAM 106, then there is a cache hit and the data may be retrieved from the corresponding cache line 112 in data RAM 108. If no entry in tag RAM 106 matches the address bits, then it is a cache miss, and cache line in data RAM 108 is replaced with data from a memory, such as a main system memory. The data removed from the cache line is written back to RAM to make room for new data in data RAM 108.

While FIG. 1A depicts a direct-mapped cache 104 for simplicity, similar concepts apply to a set-associative cache (where the tag RAM may include an array with multiple addresses that refer to multiple cache blocks or "ways") and a fully associative cache.

Figure 1B:
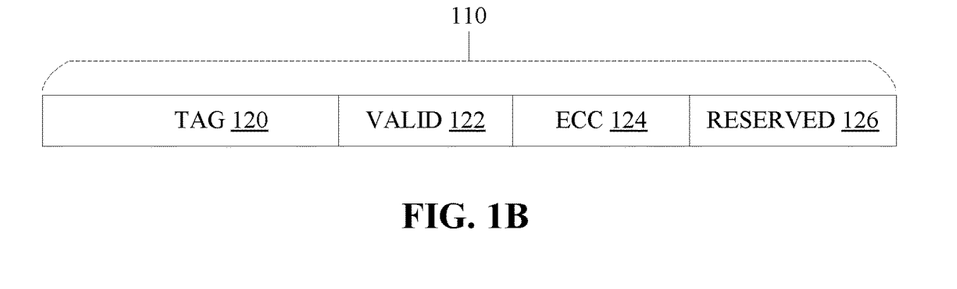
FIG. 1B depicts an example of a tag that that is stored in tag RAM.

FIG. 1B depicts an example of a tag 110 that that is stored in tag RAM 106 of FIG. 1A. In this example, tag 110 includes tag bits 120, valid bits 122, error correction code (ECC) bits 124 and reserved bits 126. Tag bits 120 are compared against the address bits of memory address 102. Valid bits 122 indicate if the tag field is used (has valid data) or is unused. Note that in some examples the valid bits 122 may include only one bit. ECC bits 124 are used for correcting errors in data RAM. In some examples, a tag (e.g., 110) may include seven bits of ECC code to cover the tag bits and a valid bit. Tag 110 also includes reserved bits, which may be generally reserved for special purposes.

Example Cache Implementations Using Pattern Tags

Figure 2A:
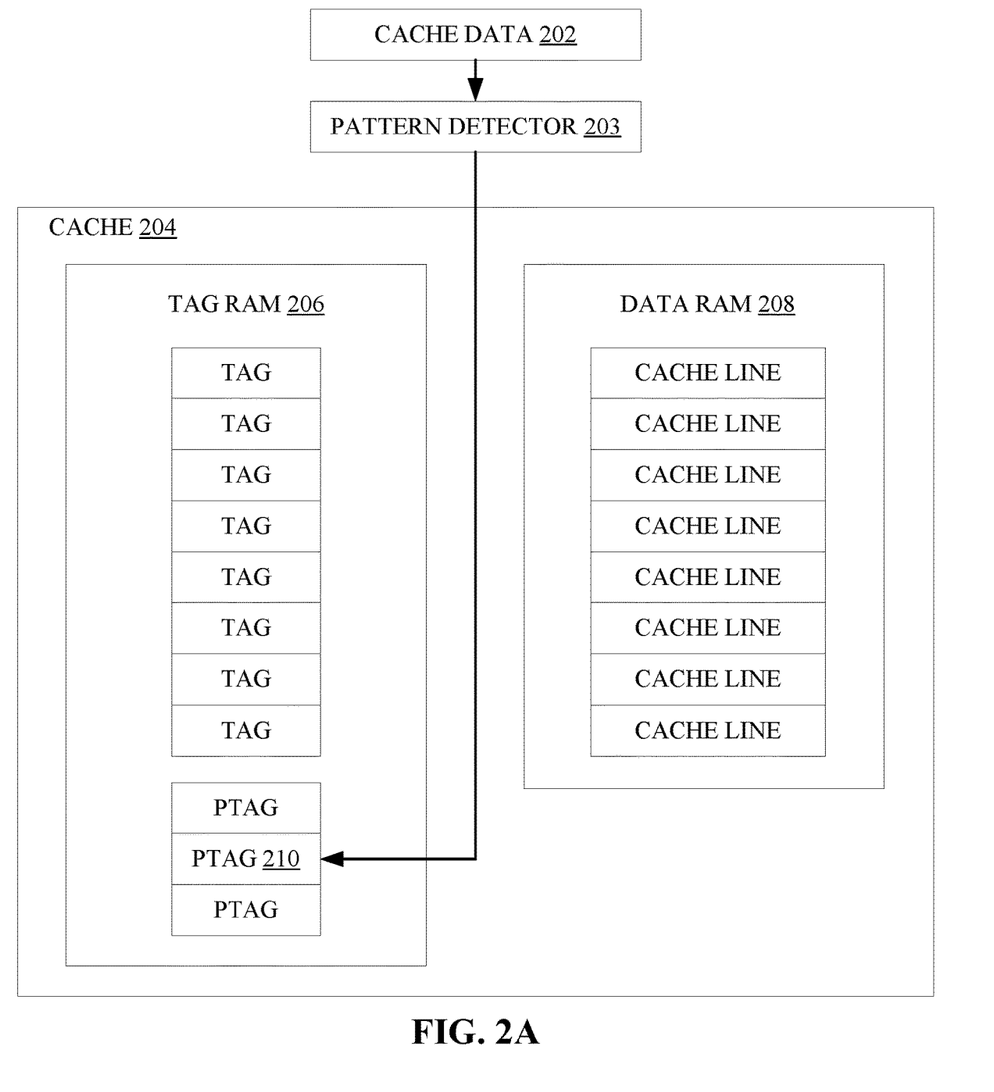
FIG. 2A depicts an example of a cache utilizing patter tag entries.

FIG. 2A depicts an example of a cache 204 utilizing pattern tag entries (e.g., 210). For example, cache data 202 may be set for caching. Prior to writing cache data 202 to cache 204, pattern detector 203 determines whether the cache data includes a pattern.

For example, a pattern may include repeating patterns of bits, such as: all zeroes, or binary representations of hexadecimal numbers, such as 5A (01011010), 6B (01101011), BB (10111011), CC (11001100), FF (11111111), and so on.

There are many use cases in which a cache may include a relatively high percentage of pattern data, such as during boot up, application launch, video recording, image data manipulation, and others. For example, during boot and application launch, large amounts of cached "data" may be repeating zeroes. As another example, when working with still or moving image data, significant portions of the image at any given time may include pattern data, such as a static background color. Such patterns may be easily stored in a pattern tag rather than in one or more cache lines thereby saving space in the data RAM of a cache.

In some examples, the patterns that pattern detector 203 may look for may be stored in a memory for comparison. For example, the patterns may be stored in an array, table, vector, hash, or similar data structure within a memory.

If a pattern is detected by pattern detector 203, then a pattern tag is written to a specific area of the tag RAM 206 reserved for pattern tags. In this example, the tag is written to pattern tag 210 within tag RAM 206. Notably, in this case, no cache line is written corresponding to pattern tag 210. This is because, as discussed below with respect to FIG. 2B, the pattern in cache data 202 may be encoded into pattern tag 210 itself, rather than using a cache line within data RAM 208. In this way, data RAM 208 may be saved and used for other, non-pattern data, which effectively increases the size of the cache without allocating additional data RAM. Because space for cache on chips is at a premium, this represents a significant improvement in cache storage to space efficiency as compared to conventional cache designs, such as discussed with respect to FIGS. 1A and 1B.

Figure 2B:
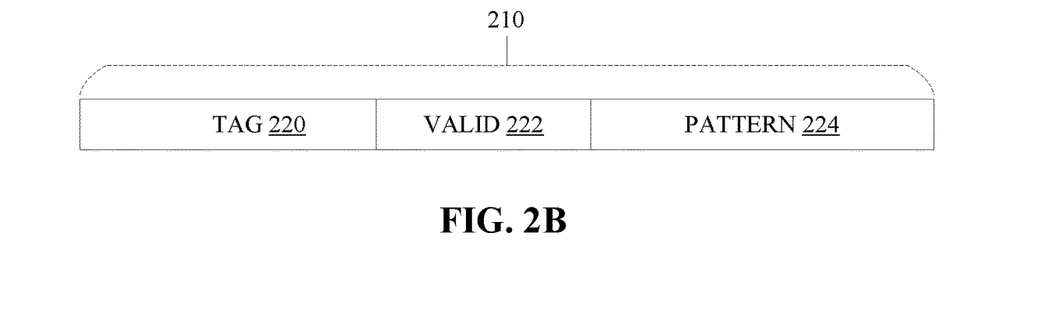
FIG. 2B depicts an example of a pattern tag, such as the pattern tag in FIG. 2A.

FIG. 2B depicts an example of a pattern tag, such as pattern tag 210 in FIG. 2A. Pattern tag 210 includes tag bits 220, which refer to the address of the memory being cached. Pattern tag 210 also includes valid bits 222. Finally, pattern tag 210 includes pattern bits 224, which encode the pattern. For example, because a traditional tag may include seven ECC bits and two reserved bits, as discussed above, in this example those bits may be used instead to encode the pattern, for example with eight bits for various patterns as described above. Because the pattern data includes a repeating pattern, the ECC bits are less important since a break in the pattern would be easily detectable.

Figure 3A:
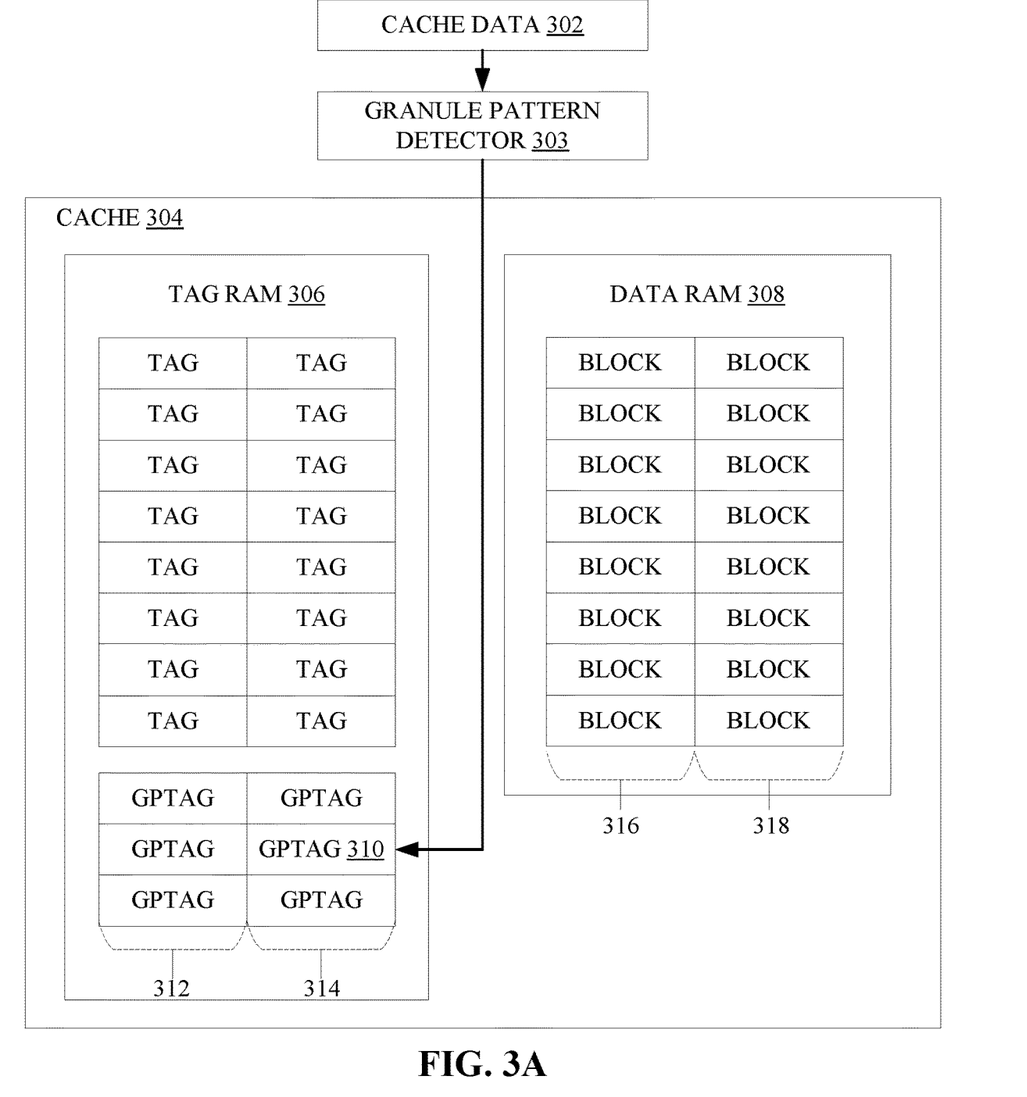
FIG. 3A depicts an example of a cache utilizing granule pattern tag entries

FIG. 3A depicts an example of a cache 304 utilizing granule pattern tag entries (e.g., 310). For example, cache data 302 may be set for caching. Prior to writing cache data 302 to cache 304, granule pattern detector 303 determines whether the cache data includes a granule (i.e., partial) pattern. In some examples, the granule pattern tag may be detected where one half of the cache data 302 comprises a repeating pattern, but the other half does not (such as depicted and described below with respect to FIG. 7).

FIG. 3A also demonstrates tag RAM 306 with multiple ways 312 and 314, which correspond to ways 316 and 318 in data RAM 308.

If a granule (or partial) pattern is detected by granule pattern detector 303, then a granule pattern tag (GPTAG) is written to a specific area of the tag RAM 306 reserved for pattern tags, and in this case granule pattern tags. In this example, the tag is written to granule pattern tag 310 within tag RAM 306. Here, no data is written to the data RAM because, as discussed below with respect to FIG. 3B, the pattern in cache data 302 may be encoded into granule pattern tag 310 itself, rather than using a line within data RAM 308. So here again, data RAM 308 may be saved and used for other, non-pattern data, which effectively increases the size of the cache without allocating additional data RAM. Further, here the efficiency is gained even when cache data only includes a pattern for a portion of the data. So, for example, only 32 bytes of data RAM may be used instead of 64 bytes in a normal cache line.

When a pattern is detected in a first granule of cache data 302, but not the second granule (i.e., cache data other than the first granule), the second granule is stored in data RAM 308.

When there is a granule match hit in cache 304 (i.e., when retrieving data from cache 304), it is first determined which granule (e.g., of a first or a second granule) has the pattern. Once determined, the index where the granule pattern is stored is determined. Finally, the non-matching data is retrieved from data RAM 308.

Note that while depicted as "granule pattern tags" in tag RAM 306 in FIG. 3A versus "pattern tags" in FIG. 2A, it is possible that a single dedicated tag RAM can store both pattern tags (i.e., for full cache line patterns) and granule pattern tags (i.e., for partial cache line patterns).

Figure 3B:
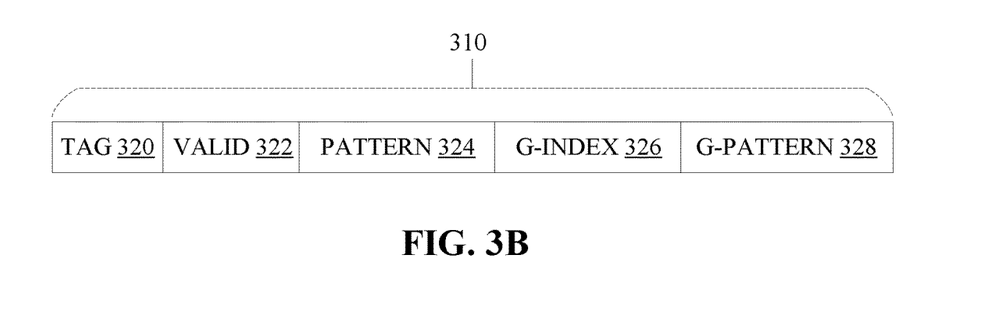
FIG. 3B depicts an example of a granule pattern tag, such as pattern tag in FIG. 3A.

FIG. 3B depicts an example of a granule pattern tag, such as pattern tag 310 in FIG. 3A. Granule pattern tag 310 includes tag bits 320, which refer to the address of the memory being cached. Granule pattern tag 310 also includes valid bits 322. Pattern tag 310 includes pattern bits 324, which encode the pattern. Granule patter tag 310 also includes a granule index 326 and a pattern granule 328.

Example Process for Using Pattern Tags

Figure 4:
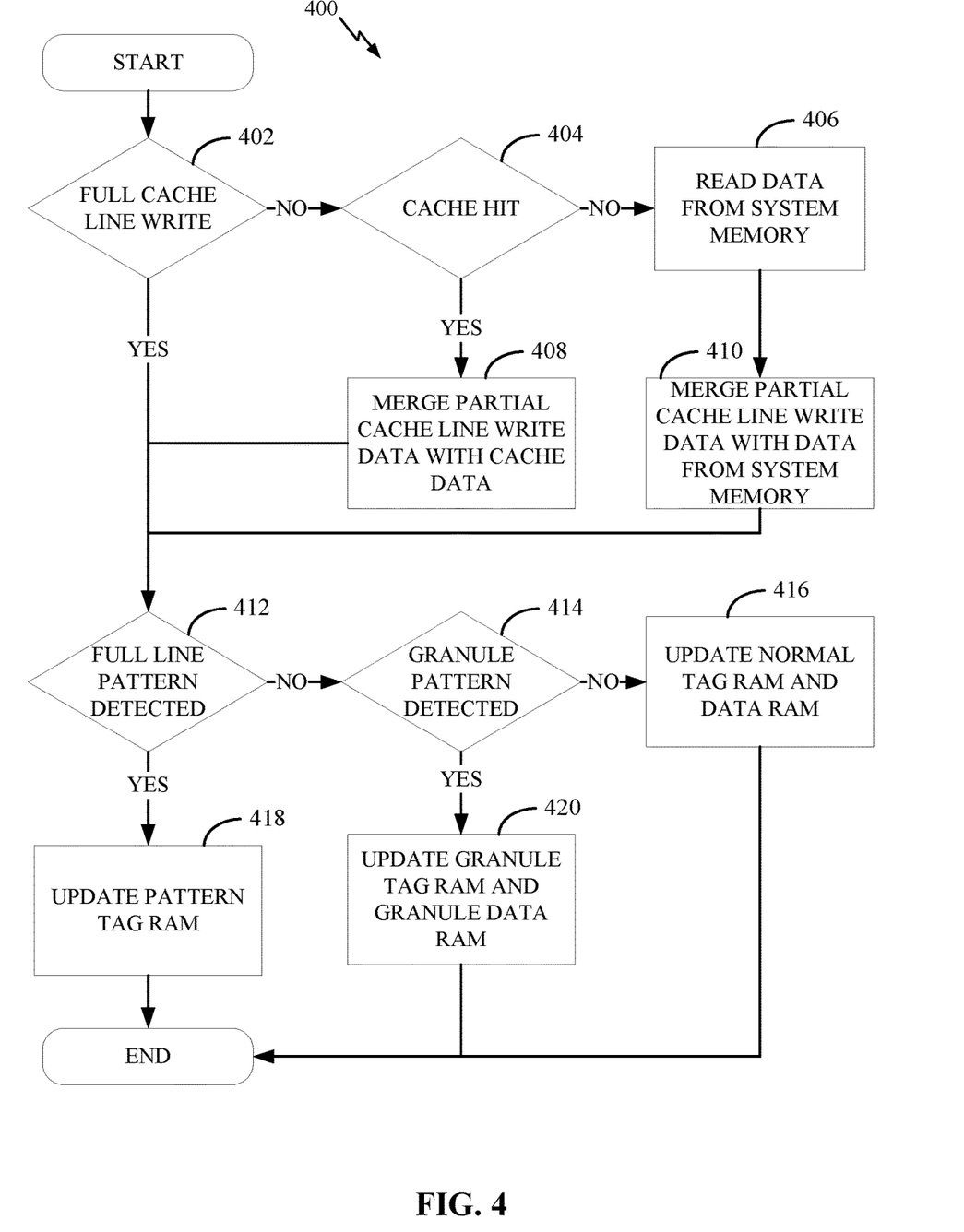
FIG. 4 depicts a process for using pattern detection and pattern tags.

FIG. 4 depicts a process 400 for using pattern detection and pattern tags (e.g., in a pattern tag RAM). For example, process 400 may be used with data structures such as those described above with respect to FIGS. 2A-2B and 3A-3B.

Process 400 begins at step 402 with receiving cache data and determining whether the cache data corresponds to a full cache line write or a partial cache line write. For example, the cache data may be received by a write buffer that buffers writes from a master. There are various types of writes that can happen from the master, such as full cache line writes and partial cache line writes. Generally, a master may write according to an interface width and it will get buffered in a write buffer where continuous address writes can be merged together. Generally, write buffer logic may determine if the writes are full or partial cache line writes and proceed accordingly.

If at step 402, it is determined that it is a full cache line write, then process 400 proceeds to step 412 where it is determined whether a full cache line pattern (such as those described above) is detected in the cache data.

If at step 412 there is a full line pattern detected, then process 400 proceeds to step 418 where a patter tag RAM entry is made, such as described above with respect to FIGS. 2A-2B.

If at step 412 a full line pattern is not detected, then process 400 proceeds to step 414 where the cache data is checked for a granule (i.e., partial line) pattern.

If at step 414 a granule pattern is detected, then process 400 proceeds to step 420 where a granule pattern tag RAM entry is made, such as described above with respect to FIGS. 3A-3B. Further, an update is made to the data RAM to store the non-matching granule in the cache data at step 420.

If at step 414, a granule pattern is not detected, then process 400 proceeds to step 416 where a normal tag RAM and data RAM entry are made in the cache.

Returning to step 402, if it is not a full cache line write, then process 400 proceeds to step 404 where it is determined whether the cache line is present in the cache or not.

If at step 404 there is a cache hit, then the data is read from the cache and process 400 proceeds to step 408 where the cache data is merged with the partial cache line write data. Then process 400 proceeds to step 412 and proceeds as described above.

If at step 404 there is a cache miss, then process 400 proceeds to step 406 where data is read from a system memory. Then at step 410 the data read from system memory is merged with the partial cache line data and process 400 proceeds to step 412 and proceeds as described above.

Notably, process 400 is just one example of an implementation of pattern tag usage and others are possible.

Figure 5:
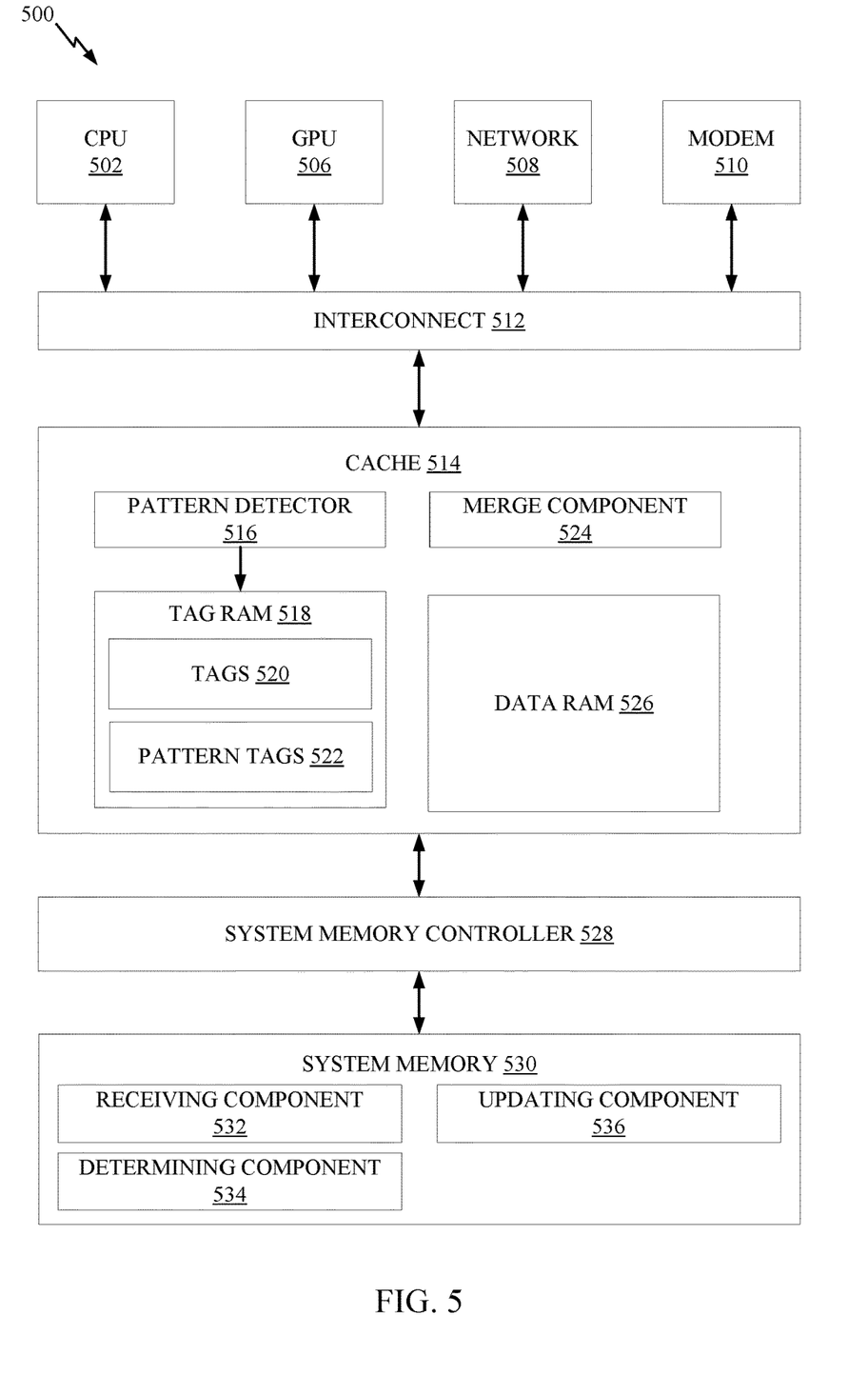
FIG. 5 depicts an example of a system configured for performing pattern detection and using pattern tags.

FIG. 5 depicts an example of a system 500 configured for performing pattern detection and using pattern tags.

System 500 includes central processing unit (CPU) 502, graphics processing unit (GPU) 506, network controller 508, and modem 510 each connected to interconnect 512. For example, interconnect 512 is a system bus in some embodiments. Notably, more components may be connected to interconnect 512 than depicted in FIG. 5 and those components selected for inclusion are mere examples of electronic device system components that may be writing data to cache 514.

Cache 514 is connected to various system components via interconnect 512. Cache 514 includes pattern detector 516, which may be configured to detect full cache line write patterns as well as partial cache line write patterns, such as granule patterns. Pattern detector 516 may detect patterns in cache data as described below with respect to FIG. 7. Pattern detector 516 is in data communication with tag RAM 518, which comprises tags 520 and pattern tags 522. For example, pattern tags 522 may be as described above with respect to FIGS. 2A-2B and 3A-3B.

Cache 514 also includes a merge component 524 that, as described above, may merge partial cache line writes with other data to form full cache line write data.

Cache 514 also includes data RAM 526, which may hold data corresponding to tags 520.

Cache 514 is connected to system memory controller 528, which is in-turn connected to system memory 530. System memory 530 may include additional functional components, such as receiving component 532, determining component 534, and updating component 536, to name a few examples. These components may, for example, enable processes such as described with respect to FIG. 4, above, and FIGS. 6A and 6B, below.

Example Methods for Managing Cache Data Using Pattern Tags

Figure 6A:
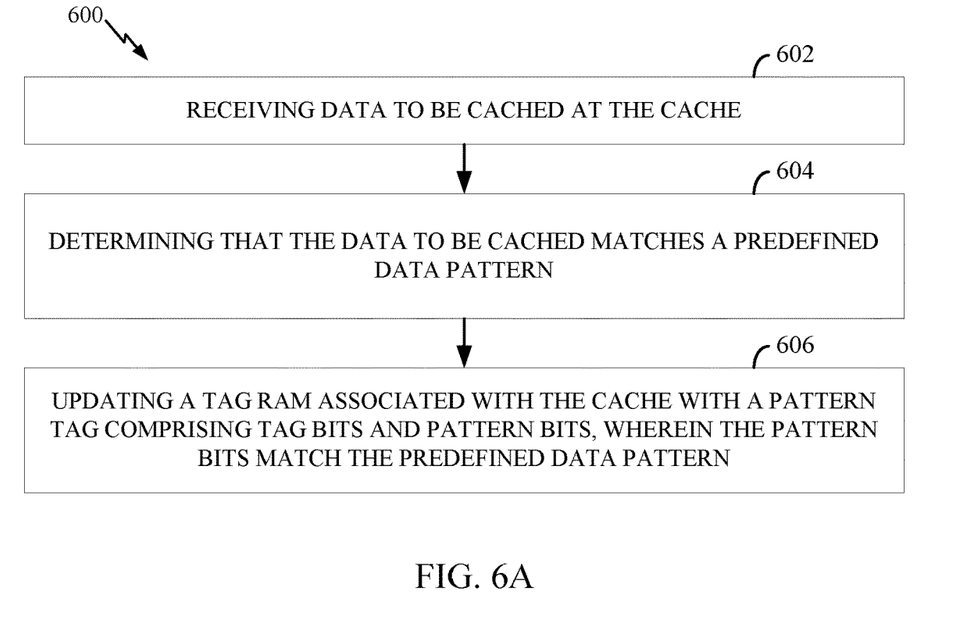
FIG. 6A depicts a method of managing data in a cache using pattern tags.

FIG. 6A depicts a method 600 of managing data in a cache. Method 600 begins at step 602 with receiving data to be cached at the cache. In some examples, the data to be cached comprises a number of bits corresponding to a full cache line of a data RAM associated with the cache.

Method 600 then proceeds to step 604 with determining that the data to be cached matches a predefined data pattern. For example, various data patterns may be defined and matched, example of which are described below with respect to FIG. 7.

Method 600 then proceeds to step 606 with updating a tag RAM associated with the cache with a pattern tag comprising tag bits and pattern bits, wherein the pattern bits match the predefined data pattern. In some examples, the pattern bits are written to ECC bit locations of the tag RAM. In other examples, the pattern bits are written to reserved bit locations of the tag RAM. In yet further examples, the pattern bits are written to other portions of the tag RAM.

Though not depicted in FIG. 6A, in some examples, method 600 further includes determining that the data to be cached comprises a number of bits corresponding to less than a full cache line of a data RAM associated with the cache, and merging the data to be cached with additional data stored in a memory prior to determining that the data to be cached matches the predefined data pattern. In some examples, the memory is a data RAM associated with the cache. In other examples, the memory is an external memory that is not a part of the cache.

Figure 6B:
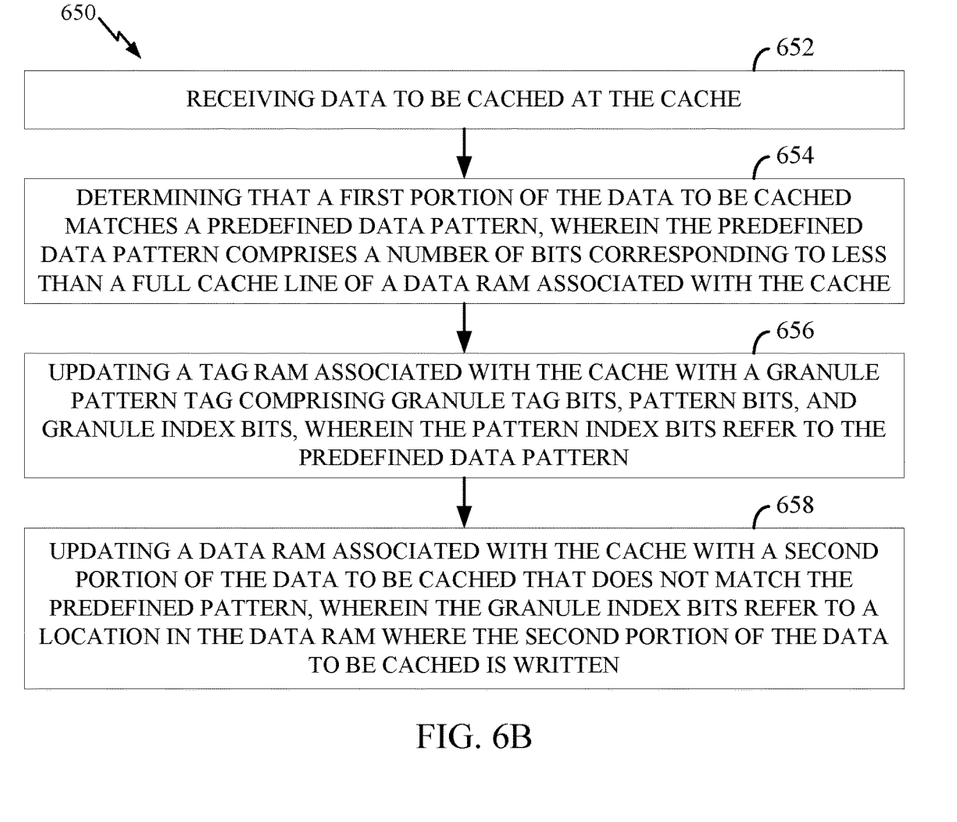
FIG. 6B depicts another method of managing data in a cache using granule pattern tags.

FIG. 6B depicts a method 650 of managing data in a cache. Method 650 begins at step 652 with receiving data to be cached at the cache. In some examples, the data to be cached comprises a number of bits corresponding to a full cache line of a data RAM associated with the cache.

Method 650 then proceeds to step 654 with determining that a first portion of the data to be cached matches a predefined data pattern, wherein the predefined data pattern comprises a number of bits corresponding to less than a full cache line of a data RAM associated with the cache. For example, examples of partial cache line data patterns are described below with respect to FIG. 7.

Method 650 then proceeds to step 656 with updating a tag RAM associated with the cache with a granule pattern tag comprising granule tag bits, pattern bits, and granule index bits, wherein the pattern bits match the predefined data pattern.

Method 650 then proceeds to step 658 with updating a data RAM associated with the cache with a second portion of the data to be cached that does not match the predefined pattern, wherein the granule index bits refer to a location in the data RAM where the second portion of the data to be cached is written. In some examples, the pattern bits are written to ECC bit locations of the tag RAM. In other examples, the pattern bits are written to reserved bit locations of the tag RAM. In yet further examples, the pattern bits may be written to other portions of the tag RAM.

Though not depicted in FIG. 6B, in some examples method 650 further includes determining that the data to be cached comprises a number of bits corresponding to less than a full cache line of the data RAM associated with the cache, and merging the data to be cached with additional data stored in a memory prior to determining that the data to be cached matches the predefined data pattern. In some examples, the memory is the data RAM associated with the cache. In other examples, the memory is an external memory that is not a part of the cache.

Notably, FIGS. 6A and 6B depict two example methods for managing cache data, but many others are possible consistent with the disclosure herein.

Example Cache Data Including Detectable Patterns

Figure 7:
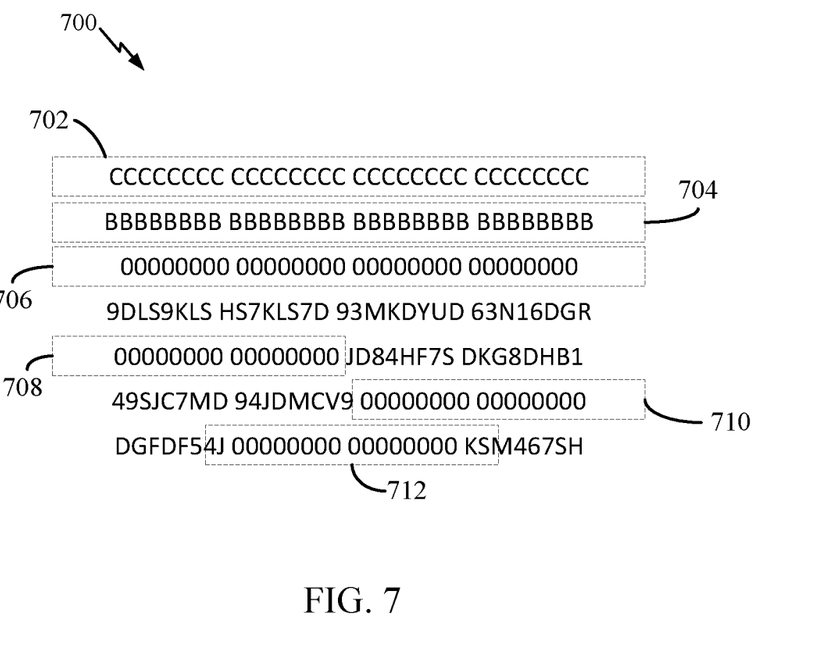
FIG. 7 depicts an example of cache data demonstrating several different kinds of detectable cache data patterns.

FIG. 7 depicts an example of cache data 700 demonstrating several different kinds of detectable cache data patterns. For example, cache data lines 702, 704, and 706 all have full cache line repeating patterns, here "CC", "BB", and "00", which are just some examples. Such full line patterns may be used with pattern tags such as described above with respect to FIGS. 2A, 2B, 4, and 6A. Further, cache data 700 includes granule patterns 708, 710, and 712, which comprise a portion of a cache line, but not the entire cache line. Such partial line patterns (i.e., granule patterns) may be used with granule pattern tags such as described above with respect to FIGS. 3A, 3B, 4, and 6B. Notably, the content and position of the patterns in FIG. 7 are just some of the possible examples.

The preceding description provides examples, and is not limiting of the scope, applicability, or embodiments set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

A processing system may be implemented with a bus architecture. The bus may include any number of interconnecting buses and bridges depending on the specific application of the processing system and the overall design constraints. The bus may link together various circuits including a processor, machine-readable media, and input/output devices, among others. A user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more executable instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media, such as any medium that facilitates transfer of a computer program from one place to another. The processor may be responsible for managing the bus and general processing, including the execution of software modules stored on the computer-readable storage media. A computer-readable storage medium may be coupled to a processor such that the processor can read information from, and write information to, the storage medium. In the alternative, the storage medium may be integral to the processor. By way of example, the computer-readable media may include a transmission line, a carrier wave modulated by data, and/or a computer readable storage medium with instructions stored thereon separate from the wireless node, all of which may be accessed by the processor through the bus interface. Alternatively, or in addition, the computer-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module, it will be understood that such functionality is implemented by the processor when executing instructions from that software module.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method for managing data in a cache, comprising:
   receiving data to be cached at the cache;
   determining that the data to be cached matches a predefined data pattern; and
   updating a tag RAM associated with the cache with a pattern tag comprising tag bits and pattern bits,
   wherein the pattern bits match the predefined data pattern.

2. The method of claim 1, wherein the pattern bits are written to ECC bit locations of the tag RAM.

3. The method of claim 1, wherein the pattern bits are written to reserved bit locations of the tag RAM.

4. The method of claim 1, wherein the data to be cached comprises a number of bits corresponding to a full cache line of a data RAM associated with the cache.

5. The method of claim 1, further comprising:
   determining that the data to be cached comprise a number of bits corresponding to less than a full cache line of a data RAM associated with the cache; and
   merging the data to be cached with additional data stored in a memory prior to determining that the data to be cached matches the predefined data pattern.

6. The method of claim 5, wherein the memory is a data RAM associated with the cache.

7. The method of claim 5, wherein the memory is an external memory that is not a part of the cache.

8. A system for managing data in a cache, comprising:
   a memory comprising executable instructions; and
   a processor in data communication with the memory and configured to execute the executable instructions and cause the system to perform a method for managing data in a cache, the method comprising:
   receiving data to be cached at the cache;
   determining that the data to be cached matches a predefined data pattern; and updating a tag RAM associated with the cache with a pattern tag comprising tag bits and pattern bits, wherein the pattern bits match the predefined data pattern.

9. The system of claim 8, wherein the pattern bits are written to one of: ECC bit locations of the tag RAM or reserve bit locations of the tag RAM.

10. The system of claim 8, wherein the data to be cached comprises a number of bits corresponding to a full cache line of a data RAM associated with the cache.

11. The system of claim 8, wherein the method further comprises:
determining that the data to be cached comprise a number of bits corresponding to less than a full cache line of a data RAM associated with the cache; and
merging the data to be cached with additional data stored in a memory prior to determining that the data to be cached matches the predefined data pattern.

12. The system of claim 11, wherein the memory is a data RAM associated with the cache.

13. The system of claim 11, wherein the memory is an external memory that is not a part of the cache.

14. A method for managing data in a cache, comprising:
receiving data to be cached at the cache;
determining that a first portion of the data to be cached matches a predefined data pattern, wherein the predefined data pattern comprises a number of bits corresponding to less than a full cache line of a data RAM associated with the cache;
updating a tag RAM associated with the cache with a granule pattern tag comprising granule tag bits, pattern bits, and granule index bits, wherein the pattern bits match the predefined data pattern; and
updating a data RAM associated with the cache with a second portion of the data to be cached that does not match the predefined pattern, wherein the granule index bits refer to a location in the data RAM where the second portion of the data to be cached is written.

15. The method of claim 14, wherein the pattern bits are written to ECC bit locations of the tag RAM.

16. The method of claim 14, wherein the pattern bits are written to reserved bit locations of the tag RAM.

17. The method of claim 14 wherein the data to be cached comprises a number of bits corresponding to a full cache line of a data RAM associated with the cache.

18. The method of claim 14, further comprising:
determining that the data to be cached comprise a number of bits corresponding to less than a full cache line of the data RAM associated with the cache; and
merging the data to be cached with additional data stored in a memory prior to determining that the data to be cached matches the predefined data pattern.

19. The method of claim 18 wherein the memory is the data RAM associated with the cache.

20. The method of claim 18, wherein the memory is an external memory that is not a part of the cache.

* * * * *